United States Patent
Mebarki et al.

(10) Patent No.: US 11,776,805 B2
(45) Date of Patent: Oct. 3, 2023

(54) SELECTIVE OXIDATION AND SIMPLIFIED PRE-CLEAN

(71) Applicant: Applied Materials, Inc., Santa Clara, CA (US)

(72) Inventors: Bencherki Mebarki, Santa Clara, CA (US); Joung Joo Lee, San Jose, CA (US); Yi Xu, San Jose, CA (US); Yu Lei, Belmont, CA (US); Xianmin Tang, San Jose, CA (US); Kelvin Chan, San Ramon, CA (US); Alexander Jansen, San Jose, CA (US); Philip A. Kraus, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 290 days.

(21) Appl. No.: 17/197,475

(22) Filed: Mar. 10, 2021

(65) Prior Publication Data

US 2021/0287898 A1  Sep. 16, 2021

Related U.S. Application Data

(60) Provisional application No. 63/036,980, filed on Jun. 9, 2020, provisional application No. 62/987,859, filed on Mar. 10, 2020.

(51) Int. Cl.
  *H01L 21/02* (2006.01)
  *H01L 21/30* (2006.01)

(52) U.S. Cl.
  CPC .... *H01L 21/0206* (2013.01); *H01L 21/02068* (2013.01); *H01L 21/3003* (2013.01)

(58) Field of Classification Search
  None
  See application file for complete search history.

(56) References Cited

U.S. PATENT DOCUMENTS

| | | |
|---|---|---|
| 2006/0003565 A1 | 1/2006 | Sasaki |
| 2006/0081916 A1 | 4/2006 | Sohn et al. |

(Continued)

FOREIGN PATENT DOCUMENTS

| | | |
|---|---|---|
| JP | H11177104 A | 7/1994 |
| JP | 4101340 B2 | 6/2008 |

(Continued)

OTHER PUBLICATIONS

Xu, Songlin, et al., "Study of tungsten oxidation in O2/H2/N2 downstream plasma", J. Vac. Sci. Technol. A 26,3 . . . , May/Jun. 2008, 360-364.

(Continued)

*Primary Examiner* — Benjamin P Sandvik
(74) *Attorney, Agent, or Firm* — Servilla Whitney LLC

(57) ABSTRACT

Method for selectively oxidizing the dielectric surface of a substrate surface comprising a dielectric surface and a metal surface are discussed. Method for cleaning a substrate surface comprising a dielectric surface and a metal surface are also discussed. The disclosed methods oxidize the dielectric surface and/or clean the substrate surface using a plasma generated from hydrogen gas and oxygen gas. The disclosed method may be performed in a single step without the use of separate competing oxidation and reduction reactions. The disclosed methods may be performed at a constant temperature and/or within a single processing chamber.

16 Claims, 5 Drawing Sheets

(56) References Cited

U.S. PATENT DOCUMENTS

| | | | |
|---|---|---|---|
| 2008/0146041 A1 | 6/2008 | Sasaki | |
| 2009/0239368 A1* | 9/2009 | Park | H01L 21/02164 257/E21.409 |
| 2010/0184267 A1* | 7/2010 | Kabe | H01L 29/513 438/771 |
| 2010/0297854 A1* | 11/2010 | Ramamurthy | H01J 37/32449 257/E21.24 |
| 2011/0300720 A1* | 12/2011 | Fu | H01J 37/32357 438/785 |
| 2014/0034632 A1* | 2/2014 | Pan | H01L 21/02252 219/520 |
| 2015/0262869 A1* | 9/2015 | Naik | H01L 21/32139 438/643 |

FOREIGN PATENT DOCUMENTS

| | | |
|---|---|---|
| KR | 19990006183 A | 1/1999 |
| KR | 20060026836 A | 3/2006 |
| WO | 2004073073 A1 | 8/2004 |

OTHER PUBLICATIONS

PCT International Search Report and Written Opinion in PCT/US2021/021688 dated Jul. 1, 2021, 9 pages.

\* cited by examiner

SELECTIVE OXIDATION AND SIMPLIFIED PRE-CLEAN

CROSS-REFERENCE TO RELATED APPLICATIONS

This application claims priority to U.S. Provisional Application No. 62/588,422, filed Nov. 19, 2017, and U.S. Provisional Application No. 63/036,980, filed Jun. 9, 2020, the entire disclosures of which are hereby incorporated by reference herein.

TECHNICAL FIELD

Embodiments of the present disclosure generally relate to methods for selective oxidation and/or cleaning a substrate surface. More particularly, embodiments of the present disclosure relate to methods for oxidizing a dielectric or semiconductor material without substantially oxidizing a metal material. Further embodiments of the present disclosure relate to methods for pre-cleaning a substrate surface having dielectric and metal surfaces within a single chamber and/or at a single temperature.

BACKGROUND

Oxidation and reduction of material surfaces are important processes in the manufacturing of semiconductor devices. These reactions can be used to modify film properties, passivate or activate surfaces in various deposition schemes and/or modify film compositions.

Many semiconductor devices contain both metal and dielectric surfaces. Current approaches for the oxidation of dielectric or semiconductor materials are not selective to metals. The unnecessary oxidation of metal materials can lead to increases in line, via or contact resistance. And processes for reducing the unwanted oxidation on metal materials often use hydrogen-based processes which can damage dielectrics. Accordingly, current methods for processing substrates having both metal and dielectric surfaces rely on alternating oxidation and reduction reactions to both oxidize the dielectric/semiconductor and undo any oxidation caused to the metal surface.

Accordingly, there is a need for an oxidation process which is selective to dielectric and semiconductor materials over metal materials.

Many modern semiconductor manufacturing processes can leave contaminants on a substrate surface. Further, extended storage or transfers between processing tools can expose substrate surfaces to contaminants. Many substrate processing methods are highly specific to a given surface chemistry. Therefore, the cleaning of substrate surfaces to remove contaminants before processing is an essential part of most semiconductor manufacturing process flows.

Many semiconductor devices contain both metal and dielectric surfaces. These surfaces may each contain contaminants which need to be removed before processing. Unfortunately, the process for removing contaminants from one surface may damage or otherwise adversely modify another surface.

Current methods of cleaning substrates having both metal and dielectric surfaces rely on alternating oxidation and reduction reactions to both remove contaminants and undo any damage caused by the other reaction. Most cleaning processes require at least three oxidation or reduction reaction processes to sufficiently clean the substrate surfaces. Yet, the oxidation and reduction reactions are typically performed at different temperatures. Therefore, a substrate often must be heated or cooled between processes. Further, the process gases used for oxidation and reduction reactions are often incompatible. Therefore, a substrate often must be transferred from one processing chamber to another for different processes.

Accordingly, there is a need for a cleaning process which is performed at one temperature. Further, there is a need for a cleaning process which is performed within one processing chamber.

SUMMARY

One or more embodiment of the disclosure relates to a method comprising exposing a substrate surface comprising a damaged dielectric surface and a reduced metal surface to a plasma formed from a plasma gas comprising hydrogen gas and oxygen gas to oxidize the damaged dielectric surface without substantially oxidizing the reduced metal surface.

Additional embodiments of the disclosure relate to a method of selectively oxidizing a dielectric surface. The method comprises exposing a substrate surface comprising a silicon nitride surface and a tungsten surface to a microwave plasma formed from a plasma gas comprising hydrogen gas, oxygen gas and argon to selectively oxidize the silicon nitride surface without oxidizing the tungsten surface. The microwave plasma has a power in a range of about 2500 W to about 3000 W. The plasma gas has an argon concentration of greater than or equal to about 95% on a molar basis, and a ratio of hydrogen gas to oxygen gas is in a range of about 1:1 to about 1:10. The substrate surface is maintained at a temperature of about 400° C. A property of the tungsten surface is similar before and after exposure to the microwave plasma. The property is selected from one or more of reflectivity, resistivity and sheet resistance.

Further embodiments of the disclosure relate to a method of cleaning a substrate. The method comprises exposing a substrate surface having a contaminated dielectric surface and a contaminated metal surface to a plasma formed from a plasma gas comprising hydrogen gas and oxygen gas to remove contaminants and form a clean dielectric surface and a clean metal surface.

BRIEF DESCRIPTION OF THE DRAWINGS

So that the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers.

As used in this specification and the appended claims, the term "substrate surface" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

Substrates may be exposed to a pretreatment process to polish, etch, reduce, oxidize, hydroxylate, anneal, UV cure, e-beam cure and/or bake the substrate surface. In addition to processing directly on the surface of the substrate itself, in the present disclosure, any of the processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Some embodiments of the present disclosure relate to methods of selectively oxidizing a substrate. Some embodiments of the disclosure relate to methods for selectively oxidizing a substrate surface having both dielectric and metal surfaces.

Some embodiments of the disclosure advantageously provide oxidation methods which are selective to dielectric or semiconductor materials/surfaces over metal material/surfaces. In this regard, the amount of oxidation observed on the metal surface is little to none.

Figure 2:
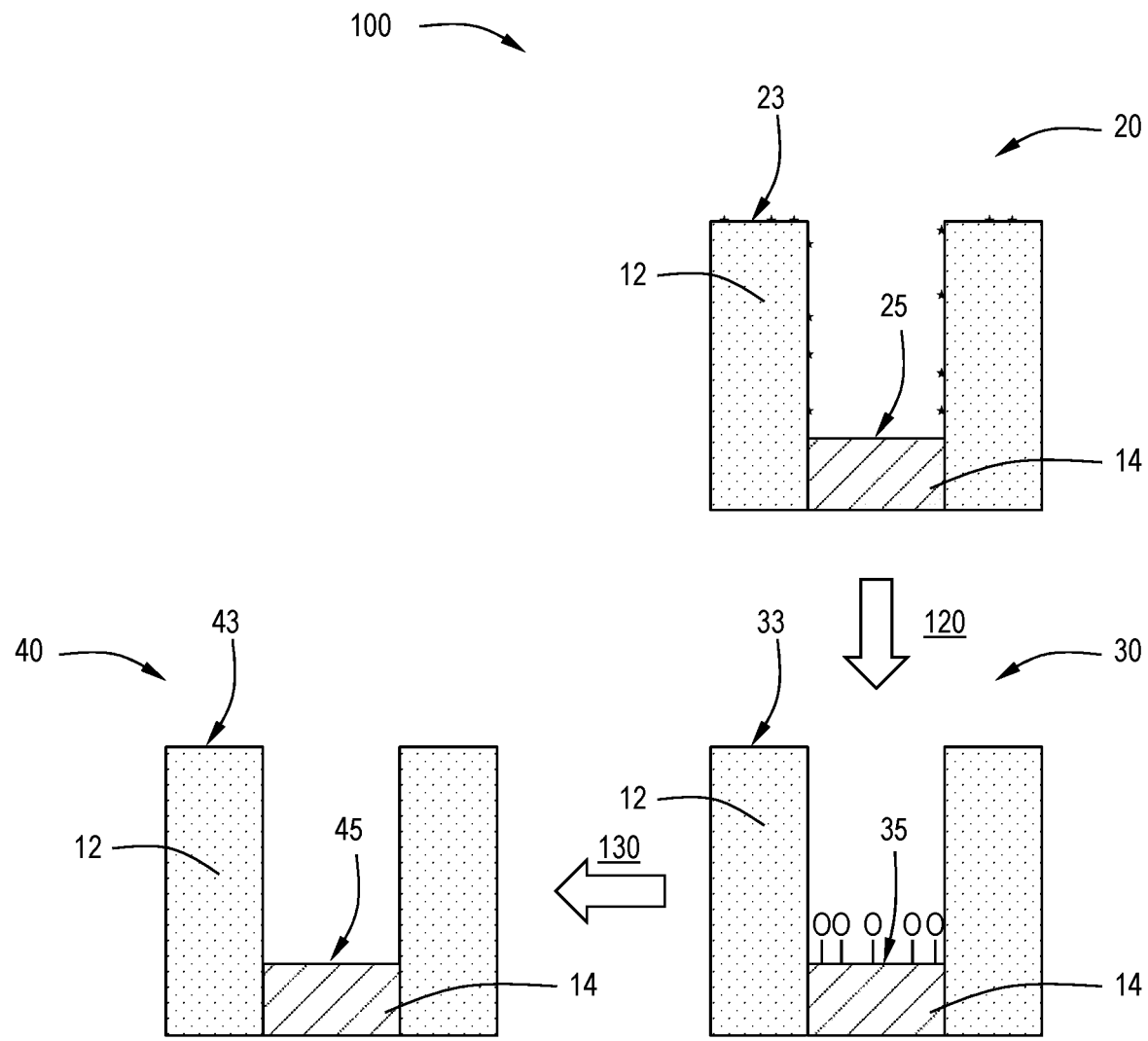
FIG. 2 illustrates an exemplary substrate during a two-step oxidation/reduction process according to methods known in the art.

The advantages of the present disclosure may be best understood in contrast to a known method. FIG. 2 illustrates a method 100 which is known in the art. The method 100 begins with a substrate 20 comprising a dielectric material 12 and a metal material 14.

Figure 1:
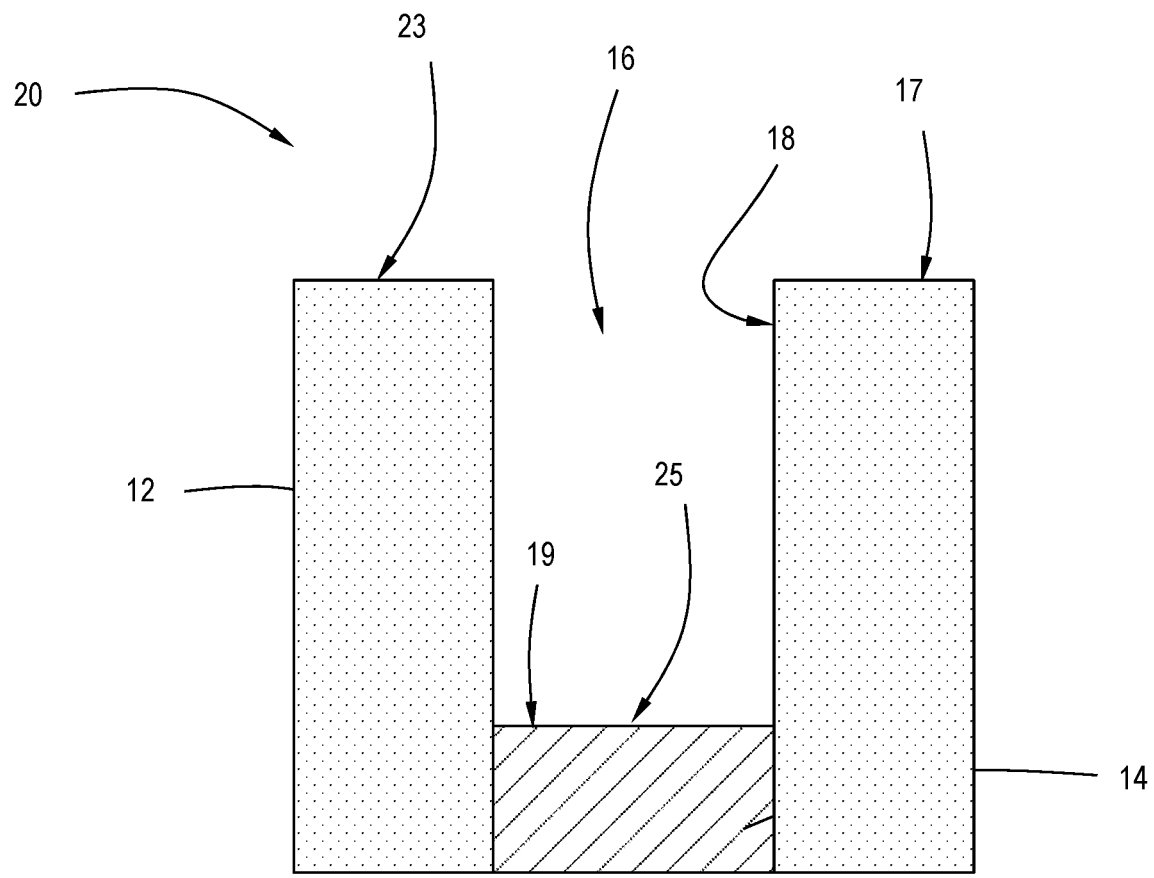
FIG. 1 illustrates an exemplary substrate with a feature according to one or more embodiment of the disclosure.

As shown in FIG. 1, in some embodiments, the substrate 20 has a feature 16 (or structure) formed therein. The feature 16 may be any suitable shape and have any suitable dimensions (e.g., width, depth, aspect ratio). For example, the feature 16 of some embodiments comprises one or more of a trench or a via. In some embodiments, the feature 16 has a top surface 17, sidewalls 18 and a bottom surface 19. The skilled artisan will recognize that while FIG. 1 shows two sidewalls 18, the disclosure is not limited to two sidewalls. For example, a round via has one continuous sidewall 18, but the cross-sectional view illustrated would appear as two sidewalls.

In some embodiments, the top surface 17 of the feature 16 comprises the damaged dielectric surface 23. In some embodiments, the bottom surface 19 comprises the reduced metal surface 25. In some embodiments, the sidewalls 18 of the feature 16 comprise the reduced metal surface 25 and the bottom surface 19 of the feature comprises the damaged dielectric surface 23.

In some embodiments, the substrate 10 comprises a semiconductor contact. The semiconductor contact of some embodiments comprises the metal material 14. In some embodiments, the semiconductor contact comprises a material to be formed within the feature 16. In some embodiments, the substrate 10 comprises a memory hole or string or other part of a 3D NAND device. In some embodiments, the substrate comprises a logic device.

In some embodiments, the dielectric material 12 comprises or consists essentially of one or more of silicon oxide, silicon nitride, or silicon oxynitride, a carbon based dielectric, silicon oxycarbide, silicon oxycarbonitride, aluminum oxide, or aluminum oxynitride. As used in this regard, a material which consists essentially of a stated material is greater than or equal to about 95%, 98%, 99% or 99.5% of the stated material on an atomic basis.

The metal material 14 may contain any suitable metal or combination of metals. In some embodiments, the metal material 14 comprises one or more of copper, tungsten, cobalt, molybdenum, ruthenium, iridium, and rhodium. In some embodiments, the metal material consists essentially of copper, tungsten or cobalt.

The method 100 begins with a damaged substrate 20. The damaged substrate 20 has a dielectric material 12 with a damaged dielectric surface 23 and a metal material 14 with a reduced metal surface 25. As used in this manner, the term "reduced metal surface" refers to an electrochemically reduced material or a metal surface that has a reduced oxidation state. In some embodiments, the reduced oxidation state of the reduced metal surface is about 0. In some embodiments, the reduced metal surface 25 is a metal surface without the presence of any metal oxides. A reduced metal surface does not refer to a decrease or other negative change in the thickness of the metal material 14.

The damaged dielectric surface 23 contains a reduced concentration of oxygen at the surface of the dielectric material 12. For illustrative purposes only, the damage to the damaged dielectric surface 23 is indicated in FIG. 2 as partial star-shaped indicia.

Method 100 continues with an oxidation process 120. The oxidation process 120 forms an oxidized substrate 30. The oxidized substrate 30 has a dielectric material 12 with an oxidized dielectric surface 33 and a metal material 14 with an oxidized metal surface 35. For illustrative purposes, the oxidized metal surface 35 is shown with oxygen atoms, whereas the dielectric material 12 within oxidized dielectric surface 33 is shown as a clean line in contrast to the marked line illustrated prior to the oxidation process 120.

The oxidized dielectric surface 33 contains an increased concentration of oxygen at the surface of the dielectric material 12 relative to the concentration of oxygen at the damaged dielectric surface 23. The oxidized metal surface 35 contains additional oxygen contaminants (e.g., metal oxides) relative to the reduced metal surface 25.

In some embodiments, the oxidation process 120 comprises a plasma process. In some embodiments, the oxidation process 120 comprises exposure to an oxidation plasma. In some embodiments, the oxidation plasma is formed using an oxygen-containing gas. In some embodiments, the oxygen-containing gas comprises oxygen gas ($O_2$). The oxidation process 120 is performed at an oxidation pressure, with the substrate maintained at an oxidation temperature and having an oxidation bias applied to the substrate 10. Other process conditions may also be controlled, as identified below.

The oxidation temperature is relatively low. In some embodiments, the oxidation temperature is in a range of about 50° C. to about 200° C., in a range of about 50° C. to about 250° C. or in a range of about 50° C. to about 150° C. In some embodiments, the oxidation temperature is about 50° C., about 75° C., about 100° C., about 125° C. or about 150° C.

The method 100 continues with a reduction process 130. The reduction process 130 forms a clean substrate 40. The clean substrate 40 has a dielectric material 12 with a clean dielectric surface 43 and a metal material 14 with a clean metal surface 45.

The clean dielectric surface 43 of some embodiments contains a reduced concentration of oxygen at the surface of the dielectric material 12 relative to the concentration of oxygen at the oxidized dielectric surface 33. For embodiments in which the oxidized dielectric surface 33 contained a surplus of oxygen relative to the expected stoichiometric ratio of oxygen to other elements, the reduction process 130 reduces the concentration of oxygen to at or about the expected stoichiometric ratio. For example, an oxygen contaminated silicon oxide surface has an oxygen content greater than the expected stoichiometric amount for silicon oxide. For embodiments in which the oxidized dielectric surface 33 contained at or about the expected stoichiometric ratio of oxygen to other elements, the reduction process 130 may have little to no effect on the oxidized dielectric surface 33 when forming the clean dielectric surface 43.

The clean metal surface 45 contains a reduced concentration of oxygen (or oxygen contaminants) at the surface of the metal material 14 relative to the concentration of oxygen at the oxidized metal surface 35. In some embodiments, the clean metal surface 45 contains little to no oxygen. In brief, the clean metal surface 45 may be described as a "bare" metal surface. In some embodiments, the clean metal surface 45 comprises substantially no oxygen atoms. As used in this regard a surface which comprises "substantially no" oxygen atoms contains less than or equal to about 95%, less than or equal to about 98%, less than or equal to about 99% or less than or equal to about 99.5% of oxygen atoms at the surface of the stated material.

In some embodiments, the reduction process 130 comprises a plasma process. In some embodiments, the reduction process 130 comprises exposure to a reduction plasma. In some embodiments, the reduction process 130 comprises exposure to a reduction plasma formed from a hydrogen-containing gas. In some embodiments, the hydrogen-containing gas comprises hydrogen gas ($H_2$).

At least some of the conditions of the oxidation process 120 and the reduction process 130 are different. For The reduction temperature is relatively high. In some embodiments, the reduction temperature is in a range of about 250° C. to about 550° C., in a range of about 300° C. to about 500° C., or in a range of about 350° C. to about 450° C. In some embodiments, the reduction temperature is about 350° C., about 400° C. or about 450° C.

Additional process conditions may also need to be changed in order to perform the reduction process 130 after the oxidation process 120. For example, the oxidation pressure and the reduction pressure may be different or the oxidation bias and the reduction bias may be different.

The modification of the process conditions between the oxidation process 120 and the reduction process 130 within the same processing chamber takes a significant amount of time. For example, the chamber must be heated or cooled to the appropriate temperature and the gas sources must be switched to different process gases.

The modification of the process conditions between the oxidation process 120 and the reduction process 130 may be performed by transitioning the substrate from one processing chamber to another. This transition between processing chambers may be faster than transitioning a single processing chamber from the conditions for the oxidation process 120 to the reduction process 130. Yet, the transition process requires additional time, thereby reducing the overall throughput and requiring a multi-chamber processing tool.

Embodiments of the present disclosure improve upon method 100 described above. Some embodiments of the disclosure are performed at a single processing temperature. The inventors have surprisingly found that the competing oxidation and reduction processes of the prior art can be performed at a single temperature with a single plasma exposure. Some embodiments of the disclosure are performed within a single processing chamber. These improvements directly correlate to a reduction in processing time and an increase in throughput.

Figure 3:
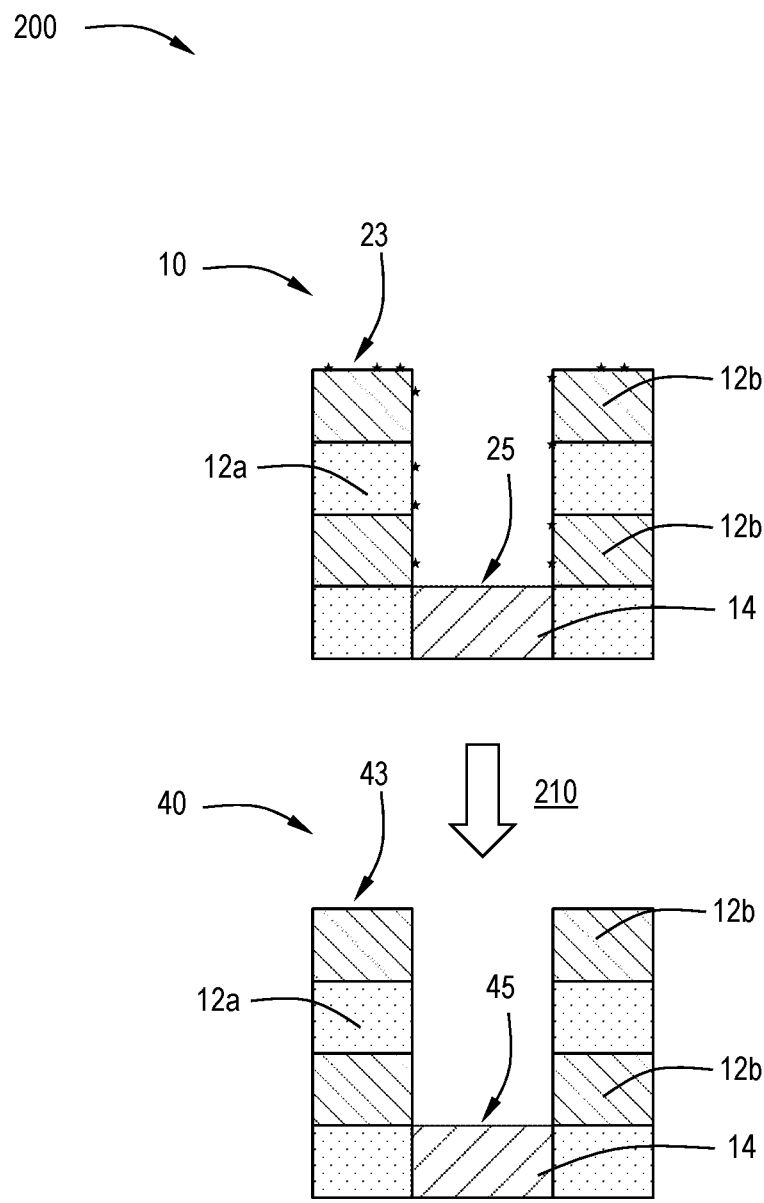
FIG. 3 illustrates an exemplary substrate during a one-step selective oxidation process according to one or more embodiment of the disclosure.

With reference to FIG. 3, one or more embodiment of the disclosure is directed to a method 200 for selectively oxidizing a substrate 10. The substrate 10 comprises a dielectric material 12 and a metal material 14. The surface of the substrate 10 is also referred to as the substrate surface. The dielectric material 12 has a damaged dielectric surface 23 and the metal material 14 has a reduced metal surface 25. For illustrative purposes only, the damage to the damaged dielectric surface 23 is indicated in FIG. 3 as partial star-shaped indicia. As used throughout this disclosure the dielectric material 12 may also refer to a semiconductor material.

FIG. 3 depicts one embodiment in which the dielectric material 12 comprises a first dielectric material 12a and a second dielectric material 12b. In some embodiments, as shown, the first dielectric material 12a and the second dielectric material 12b are arranged in alternating layers. In some embodiments, the first dielectric material 12a comprises or consists essentially of silicon oxide and the second dielectric material 12b comprises or consists essentially of silicon nitride. In some embodiments, the dielectric material 12 comprises only one dielectric material.

While a substrate 20 with a specific structure and patterning of materials is shown in FIG. 3, the illustration shown is not intended to be limiting.

The method 200 exposes the substrate surface (i.e. the damaged dielectric surface 23 and the reduced metal surface 25) to a plasma at operation 210 to form a clean substrate 40 having a clean dielectric surface 43 and a clean metal surface 45. The method 200 is advantageously performed by a single operation rather than the two or more operations of method 100. The single operation method 200 removes the need for modifying the processing chamber or transferring the substrate between multiple chambers on a cluster tool.

The plasma is formed from a plasma gas comprising hydrogen gas ($H_2$) and oxygen gas ($O_2$). In some embodiments, the plasma gas consists essentially of hydrogen gas ($H_2$) and oxygen gas ($O_2$). As used in this regard, a plasma gas "consisting essentially of" hydrogen gas and oxygen gas has a molar concentration of greater than or equal to about 95%, greater than or equal to about 98%, greater than or equal to about 99% or greater than or equal to about 99.5% of hydrogen gas and oxygen gas, excluding any inert diluent gas or gasses.

In some embodiments, the plasma gas further comprises an inert diluent gas. As used in this regard, an inert gas does not alter the oxidation state (i.e., oxidize or reduce) the substrate surface. In some embodiments, the diluent gas comprises or consists essentially of argon. As used in this regard, a diluent gas which consists essentially of argon comprises greater than or equal to about 95%, greater than or equal to about 98%, greater than or equal to about 99% or greater than or equal to about 99.5% on a molar basis of all inert gases.

In some embodiments, the plasma gas is formed by providing the hydrogen gas, oxygen gas and optional diluent gas at preset flow rates. In some embodiments, plasma gas is formed by delivering to a processing chamber: hydrogen gas with a hydrogen flow rate, oxygen gas with an oxygen flow rate, and a diluent gas with a flow rate.

In some embodiments, the hydrogen flow rate is in a range of about 0 to about 30 sccm or in a range of about 0 sccm to about 15 sccm. In some embodiments, the hydrogen flow rate is less than or equal to about 30 sccm, less than or equal to about 15 sccm or less than or equal to about 10 sccm. In some embodiments, the oxygen flow rate is in a range of about 10 sccm to about 50 sccm or in a range of about 10 sccm to about 20 sccm. In some embodiments, the oxygen flow rate is about 10 sccm, about 15 sccm or about 30 sccm. In some embodiments, the diluent flow rate is in a range of about 3000 sccm to about 6000 sccm, in a range of about 4000 sccm to about 5000 sccm or in a range of about 4900 sccm to about 5000 sccm. In some embodiments, the diluent flow rate is about 5000 sccm.

In some embodiments, the ratio of the oxygen flow rate to the hydrogen flow rate is in a range of about 1:2 to about 20:1, in a range of 1:1 to about 10:1, in a range of about 1:1 to about 5:1 in a range of about 5:1 to about 10:1, in a range of about 5:1 to about 15:1, or in a range of about 10:1 to about 15:1. This ratio may also be referred to as the flow rate ratio. In some embodiments, the molar ratio of hydrogen gas to oxygen gas within the plasma gas is in a range of about 1:2 to about 20:1, in a range of 1:1 to about 10:1, in a range of about 1:1 to about 5:1 in a range of about 5:1 to about 10:1, in a range of about 5:1 to about 15:1, or in a range of about 10:1 to about 15:1.

In some embodiments, the plasma is a conductively coupled plasma (CCP). The frequency of the plasma can be any suitable frequency. In some embodiments, the plasma frequency is in the range of 50 Hz to 100 MHz, or in the range of 100 kHz, to 60 MHz, or in the range of 500 kHz to 40 MHz, or about 13.56 MHz.

The power of the plasma may be any suitable power. In some embodiments, the plasma power is in a range of about 100 W to about 500 W, in a range of about 100 W to about 300 W, or in a range of about 300 W to about 500 W. In some embodiments, the plasma power is about 200 W or about 400 W. In some embodiments, the plasma is a microwave plasma with a power in a range of about 2500 W to about 3000 W or in a range of about 2800 W to about 2900 W. In some embodiments, there is no bias power applied to the substrate or substrate support.

The substrate surface may be exposed to the plasma for any suitable period of time. In some embodiments, the substrate surface is exposed to the plasma for a period in a range of about 15 minutes to about 30 minutes.

In some embodiments, the method 200 further comprises exposing the substrate 10 to a plasma formed from hydrogen gas. In some embodiments, these plasma exposures are performed before exposing the substrate to the plasma described above with respect to operation 210.

The substrate surface may be maintained at a suitable process temperature during operation 210. In some embodiments, the substrate surface is maintained at a temperature in a range of about 100° C. to about 400° C. In some embodiments, the substrate surface is maintained at about 400° C.

The method 200 may be carried out at any suitable pressure. In some embodiments, the pressure of the processing chamber for method 200 is maintained at a pressure in a range of about 5 Torr to about 50 Torr.

The single plasma exposure at operation 210 is able to oxidize the damaged dielectric surface 23 without oxidizing the reduced metal surface 25 to form a clean dielectric surface 43 and a clean metal surface 45, as described above. Yet, in contrast to method 100, method 200 is performed in a single processing chamber at a single processing temperature.

Oxidizing the damaged dielectric surface 23 without oxidizing the reduced metal surface 25 may be described as selectively oxidizing the damaged dielectric surface 23. In some embodiments, selectively oxidizing the damaged dielectric surface 23 means that a property of the reduced metal surface is similar before and after being exposed to the plasma at operation 210. In some embodiments, the property is selected from one or more of reflectivity, resistivity and sheet resistance. As used in this regard, reflectivity of the clean metal surface is similar to the reduced metal surface if it is within ±5%. As used in this regard, resistivity of the clean metal surface is similar to the reduced metal surface if it is within ±10%. As used in this regard, sheet resistance of the clean metal surface is similar to the reduced metal surface if it is within ±10%.

In some embodiments, the damaged dielectric surface 23 contains a relatively low concentration of oxygen. In some embodiments, the oxygen content of the damaged dielectric surface 23 may be less than 20 atomic percent. In these embodiments, the method 200 increases the concentration of oxygen to provide a clean dielectric surface 43. In some embodiments, the clean dielectric surface 43 has an oxygen content of greater than or equal to about 45 atomic percent. In some embodiments, the method 200 increases the oxygen content of the damaged dielectric surface 23 to a range of about 40 atomic percent to about 50 atomic percent.

In some embodiments, the method 200 further comprises selectively depositing a bulk metal layer on the clean metal surface 45. In some embodiments, the bulk metal layer entirely fills the feature. In some embodiments, the bulk metal layer is deposited on the bottom surface 19 of the feature, growing from the bottom up. In some embodiments, no deposition is observed on the top surface 17 or sidewalls 18. In some embodiments, the bulk metal layer partially fills the feature 16. In some embodiments, the bulk metal layer is coplanar with the top surface 17. In some embodiments, the metal material comprises tungsten and the bulk metal layer comprises tungsten.

As used in this disclosure, the term "selectively depositing" a film on one surface "over" another surface, and the like, means that a first amount of the film is deposited on the first surface and a second amount of film is deposited on the second surface, where the second amount of film is less than the first amount of film, or no film is deposited on the second surface.

The term "over" does not imply a physical orientation of one surface on top of another surface, rather a relationship of the thermodynamic or kinetic properties of the chemical reaction with one surface relative to the other surface. For example, selectively depositing a film onto a metal surface over a dielectric surface means that the film deposits on the metal surface and less or no film deposits on the dielectric surface; or that the formation of the film on the metal surface is thermodynamically or kinetically favorable relative to the formation of the film on the dielectric surface.

The selectivity of a deposition process may be expressed as a multiple of growth rate. For example, if one surface is grown (or deposited on) 25 times faster than a different surface, the process would be described as having a selectivity of 25:1. In this regard, higher ratios indicate more selective processes. The selectivity of a deposition process may also be expressed by stating the amount of film which can be deposited on a first surface before the film deposits on a second surface.

Some embodiments of the present disclosure relate to methods of cleaning a substrate. Some embodiments of the disclosure relate to methods for cleaning a substrate surface having both dielectric and metal surfaces. Some embodiments of the disclosure relate to methods of cleaning a semiconductor contact.

Some embodiments of the disclosure advantageously provide cleaning methods which are performed at a single process temperature. Some embodiments of the disclosure provide methods which are performed in a single processing chamber. In this regard, some embodiments of the disclosure provide cleaning methods with shorter process times and/or higher throughput.

Figure 4:
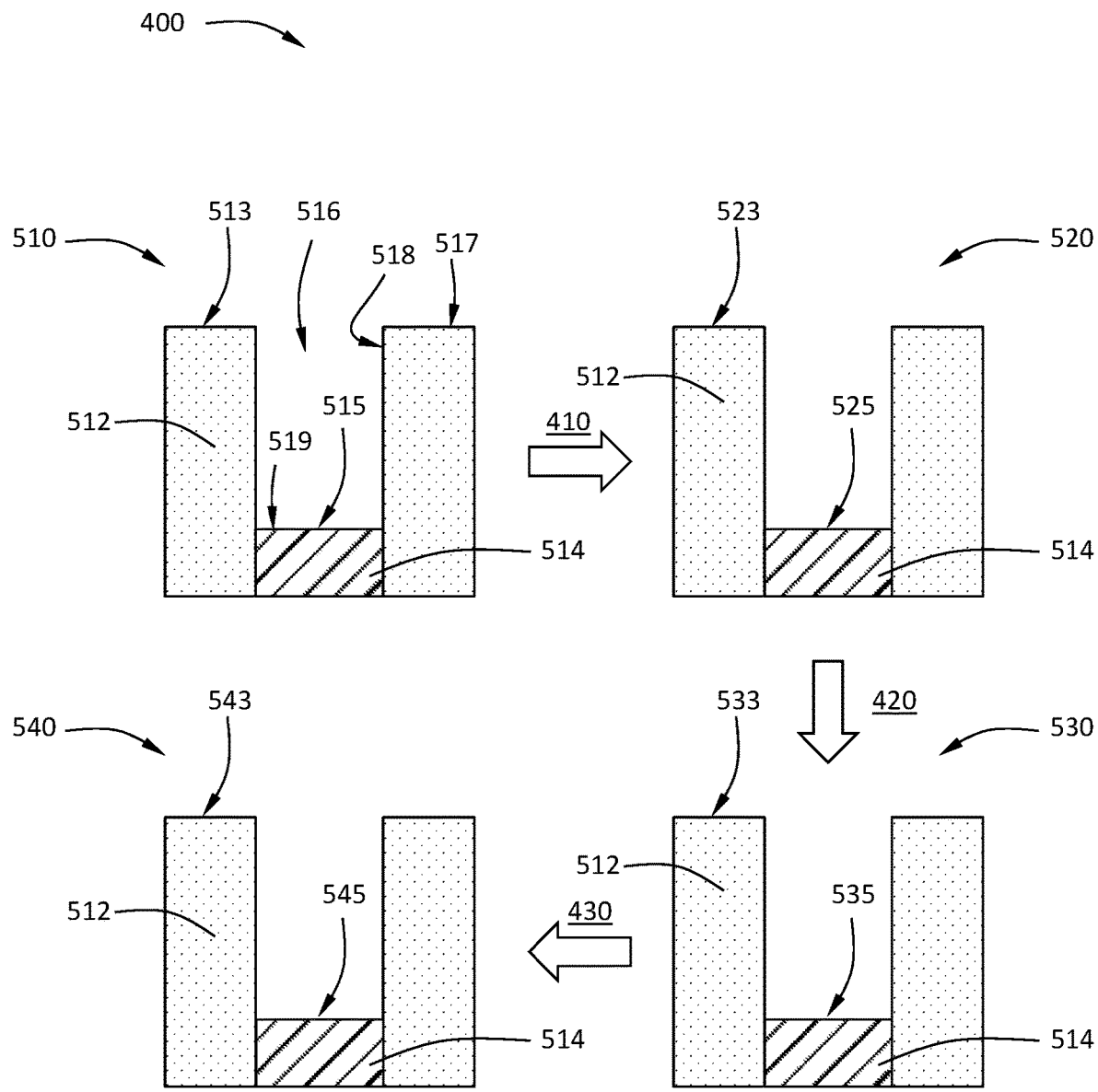
FIG. 4 illustrates an exemplary substrate during a three-step cleaning process according to methods known in the art.

The advantages of the present disclosure are best understood in contrast with known cleaning methods. FIG. 4 illustrates an exemplary method which is known in the art. The method 400 begins with a substrate 510 comprising a dielectric material 512 and a metal material 514.

In some embodiments, the substrate 510 has a feature 516 formed therein. The feature 516 may be any suitable shape. For example, the feature 516 of some embodiments comprises one or more of a trench or a via. In some embodiments, the feature 516 has a top surface 517, sidewalls 518 and a bottom surface 519. The skilled artisan will recognize that while FIG. 4 shows two sidewalls 518, the disclosure is not limited to two sidewalls. For example, a round via technically has one continuous sidewall 518, but the cross-sectional view illustrated would appear as two sidewalls.

In some embodiments, the top surface 517 comprises the contaminated dielectric surface 513. In some embodiments, the sidewalls 518 comprise the contaminated dielectric surface 513 or the contaminated metal surface 515 (not shown). In some embodiments, the bottom surface 519 comprises the contaminated metal surface 515. In some embodiments, the substrate 510 comprises a semiconductor contact. The semiconductor contact of some embodiments comprises the metal material 514. In some embodiments, the semiconductor contact comprises a material to be formed within the feature 516.

In some embodiments, the dielectric material 512 comprises or consists essentially of one or more of silicon oxide, silicon nitride, or silicon oxynitride. As used in this regard, a material which consists essentially of a stated material is greater than or equal to about 95%, 98%, 99% or 99.5% of the stated material on an atomic basis.

The metal material 514 may contain any suitable metal or combination of metals. In some embodiments, the metal material 514 comprises one or more of tungsten, cobalt, molybdenum, ruthenium, iridium, and rhodium. In some embodiments, the metal material consists essentially of tungsten or cobalt.

The surface of the substrate 510, also referred to as the substrate surface, is contaminated. In some embodiments, the contaminated substrate surface comprises the contaminated dielectric surface 513 and the contaminated metal surface 515. In some embodiments, the substrate surface is contaminated with one or more of carbon, nitrogen, oxygen, organic residues ($-CH_x$) or perfluoro organic residues ($-CF_x$).

The dielectric material 512 has a contaminated dielectric surface 513 and the metal material 514 has a contaminated metal surface 515. In some embodiments, the contaminants on the contaminated dielectric surface 513 comprise one or more of carbon, nitrogen, organic residues ($-CH_x$) or perfluoro organic residues ($-CF_x$). In some embodiments, the contaminants on the contaminated metal surface 515 comprise one or more of nitrogen, oxygen, organic residues ($-CH_x$) or perfluoro organic residues ($-CF_x$). In some embodiments, contaminants on the metal surface 515 are different than the contaminants on the dielectric surface 513. In some embodiments, the contaminants on the metal surface 515 are the same as the contaminants on the dielectric surface 513. In some embodiments, the concentration per unit area of contaminants on the dielectric surface 513 is different than the concentration per unit area of the contaminants on the metal surface 515. In some embodiments, the concentration per unit area of contaminants on the dielectric surface 513 is the same as the concentration per unit area of the contaminants on the metal surface 515.

The method 400 begins with a first reduction process 410. The first reduction process 410 forms a damaged substrate 520. The damaged substrate 520 has a dielectric material 512 with a damaged dielectric surface 523 and a metal material 514 with a reduced metal surface 525. As used in this manner, the term "reduced metal surface" refers to a metal surface that has a reduced oxidation state. Reducing the metal surface does not refer to a difference or change in thickness of the metal material.

The damaged dielectric surface 523 contains a reduced concentration of contaminants. In some embodiments, the damaged dielectric surface 523 contains substantially no contaminants. In this regard, the surface of the dielectric material 512 has been cleaned. But due to the first reduction process 410 the damaged dielectric material contains a reduced concentration of oxygen at the surface of the dielectric material 512. The reduced metal surface 525 contains a reduced concentration of the contaminants present on the contaminated metal surface 515.

In some embodiments, the first reduction process 410 comprises a plasma clean process. In some embodiments, the first reduction process 410 comprises exposure to a hydrogen-containing plasma. In some embodiments, the first reduction process 110 comprises exposure to a hydrogen plasma. The skilled artisan will recognize that a "hydrogen plasma" is a plasma formed using molecular hydrogen ($H_2$), and that a hydrogen-containing plasma may include $H_2$.

The first reduction process 410 is performed at a first pressure, with the substrate maintained at a first temperature and having a first bias. Other process conditions may also be controlled. The first temperature is relatively high. In some embodiments, the first temperature is in a range of about 250° C. to about 550° C., in a range of about 300° C. to about 500° C., or in a range of about 350° C. to about 450° C. In some embodiments, the first temperature is about 350° C., about 400° C. or about 450° C.

The method 400 continues with a second process, referred to as a second oxidation process 420. The skilled artisan will recognize that the ordinals first, second, etc. used in this context merely provide a manner of differentiating the naming of the individual process steps and should not be taken as limiting the method to a particular order or number of reactions or reactive species. The second oxidation process 420 forms an oxidized substrate 530. The oxidized substrate 530 has a dielectric material 512 with an oxidized dielectric surface 533 and a metal material 514 with an oxidized metal surface 535.

The oxidized dielectric surface 533 contains an increased concentration of oxygen at the surface of the dielectric material 512 relative to the concentration of oxygen at the damaged dielectric surface 523. For embodiments in which the contaminated metal surface contained nitrogen, the oxidized metal surface 535 contains little to no nitrogen. In some embodiments, "little to no nitrogen" means a nitrogen content less than 10%, 9%, 8%, 7.5% or 7% nitrogen (on an atomic basis). However, the oxidized metal surface 535 contains additional oxygen contaminants relative to the reduced metal surface 525.

In some embodiments, the second oxidation process 420 comprises a plasma process. In some embodiments, the second oxidation process 420 comprises exposure to an oxygen-containing plasma. In some embodiments, the oxygen-containing plasma is formed using oxygen gas ($O_2$). The second oxidation process 420 is performed at a second pressure, with the substrate maintained at a second temperature and having a second bias. Other process conditions may also be controlled.

At least some of the conditions of the first reduction process 410 and the second oxidation process 420 are different. For example, the second temperature is relatively low. In some embodiments, the second temperature is in a range of about 50° C. to about 200° C., in a range of about 50° C. to about 250° C. or in a range of about 50° C. to about 150° C. In some embodiments, the second temperature is about 50° C., about 75° C., about 100° C., about 125° C. or about 150° C. Additional process conditions may also need to be changed in order to perform the second oxidation process 420 after the first reduction process 410. For example, the first pressure and the second pressure may be different or the first bias and the second bias may be different.

The method 400 continues with a third reduction process 430. The third reduction process 430 forms a clean substrate 540. The clean substrate 540 has a dielectric material 512 with a clean dielectric surface 543 and a metal material 514 with a clean metal surface 545.

The clean dielectric surface 543 of some embodiments contains a reduced concentration of oxygen at the surface of the dielectric material 512 relative to the concentration of oxygen at the oxidized dielectric surface 533. For embodiments in which the oxidized dielectric surface 533 contained a surplus of oxygen relative to the expected stoichiometric ratio of oxygen to other elements, the third reduction process 430 reduces the concentration of oxygen to at or about the expected stoichiometric ratio. For example, an oxygen contaminated silicon oxide surface has an oxygen content greater than the stoichiometric amount for silicon oxide. For embodiments in which the oxidized dielectric surface contained at or about the expected stoichiometric ratio of oxygen to other elements, the third reduction process 430 may have little to no effect on the oxidized dielectric surface 533 when forming the clean dielectric surface 543. In brief, the clean dielectric surface 543 contains fewer contaminants than the contaminated dielectric surface 513.

The clean metal surface 545 contains a reduced concentration of oxygen at the surface of the metal material 514 relative to the concentration of oxygen at the oxidized metal surface 535. In some embodiments, the clean metal surface 545 contains little to no oxygen. The clean metal surface 545 also contains little to no nitrogen contaminants. In brief, the clean metal surface 545 contains fewer contaminants than the contaminated metal surface 515 and may otherwise be described as a bare metal surface.

In some embodiments, the third reduction process 430 comprises a plasma process. In some embodiments, the third reduction process 430 comprises exposure to a hydrogen-containing plasma. In some embodiments, the third reduction process 430 comprises exposure to a hydrogen plasma.

At least some of the conditions of the second oxidation process 420 and the third reduction process 430 are different. For example, the third temperature is relatively high. In some embodiments, the first temperature is in a range of about 250° C. to about 550° C., in a range of about 300° C. to about 500° C., or in a range of about 350° C. to about 450° C. In some embodiments, the first temperature is about 350° C., about 400° C. or about 450° C.

Additional process conditions may also need to be changed in order to perform the third reduction process 430 after the second oxidation process 420. For example, the second pressure and the third pressure may be different or the second bias and the third bias may be different.

In some embodiments, the process conditions for the first reduction process 410 and the third reduction process 430 are the same. In some embodiments, the process conditions for the first reduction process 410 and the third reduction process 430 are different.

The modification of the process conditions between the first reduction process 410, the second oxidation process 420 and the third reduction process 430 within the same processing chamber takes a significant amount of time. For example, the chamber must be heated or cooled to the appropriate temperature and the gas sources must be switched to different process gases.

The modification of the process conditions between the first reduction process 410, the second oxidation process 420 and the third reduction process 430 may be performed by transitioning the substrate from one processing chamber to another. This transition between processing chambers may be faster than transitioning a single processing chamber from the conditions for the first reduction process 410 to the second oxidation process 420 and/or the second oxidation process 420 to the third reduction process 430. Yet, the transition process requires additional time, thereby reducing the overall throughput and requiring a multi-chamber processing tool.

Some embodiments of the present disclosure improve upon the known process described above. Some embodiments of the disclosure are performed at a single processing temperature. Some embodiments of the disclosure are performed within a single processing chamber. These improvements directly correlate to a reduction in processing time and an increase in throughput.

Figure 5:
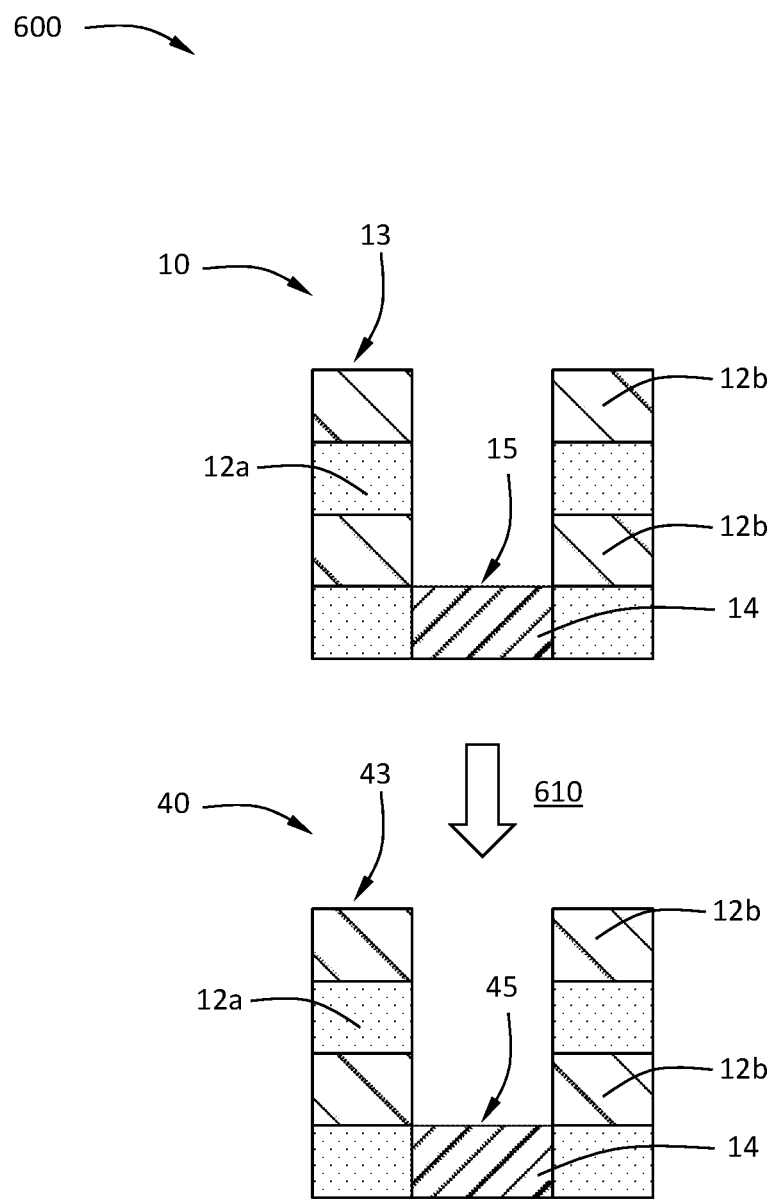
FIG. 5 illustrates an exemplary substrate during a one-step cleaning process according to one or more embodiment of the disclosure.

With reference to FIG. 5, one or more embodiment is directed to a method 600 for cleaning a substrate 510. The substrate 510 is as described above. The substrate 510 comprises a dielectric material 512 and a metal material 514. The surface of the substrate 510, also referred to as the substrate surface, is contaminated. Therefore, the dielectric material 512 has a contaminated dielectric surface 513 and the metal material 514 has a contaminated metal surface 515. The contaminants are described above.

FIG. 5 depicts a dielectric material 512 which comprises a first dielectric material 512a and a second dielectric material 512b. In some embodiments, as shown, the first dielectric material 512a and the second dielectric material 512b are arranged in alternating layers. In some embodiments, the first dielectric material 512a comprises or consists essentially of silicon oxide and the second dielectric material 512b comprises or consists essentially of silicon nitride.

The method 600 exposes the substrate surface (i.e. the contaminated dielectric surface 513 and the contaminated metal surface 515) to a plasma at cleaning operation 610 to form a clean substrate 540 having a clean dielectric surface 543 and a clean metal surface 545. The plasma is formed from a plasma gas comprising hydrogen gas ($H_2$) and oxygen gas ($O_2$). In some embodiments, the plasma consists essentially of hydrogen gas ($H_2$) and oxygen gas ($O_2$). In some embodiments, the plasma gas further comprises an inert diluent gas. In some embodiments, the diluent gas comprises or consists essentially of argon.

In some embodiments, the plasma gas is formed by providing the hydrogen gas, oxygen gas and optional diluent gas at preset flow rates. In some embodiments, plasma gas is formed by delivering to a processing chamber: hydrogen gas with a hydrogen flow rate, oxygen gas with an oxygen flow rate, and a diluent gas with a flow rate.

In some embodiments, the hydrogen flow rate is in a range of about 50 to about 750 sccm. In some embodiments, the hydrogen flow rate is about 60 sccm or about 600 sccm. In some embodiments, the oxygen flow rate is in a range of about 50 sccm to about 75 sccm. In some embodiments, the oxygen flow rate is about 60 sccm. In some embodiments, the diluent flow rate is in a range of about 2500 sccm to about 5000 sccm. In some embodiments, the diluent flow rate is about 3000 sccm.

In some embodiments, the ratio of the hydrogen flow rate to the oxygen flow rate is in a range of about 1:2 to about 20:1, in a range of 1:1 to about 10:1, in a range of about 1:1 to about 5:1 in a range of about 5:1 to about 10:1, in a range of about 5:1 to about 15:1, or in a range of about 10:1 to about 15:1. This ratio may also be referred to as the flow rate ratio. In some embodiments, the molar ratio of hydrogen gas to oxygen gas within the plasma gas is in a range of about 1:2 to about 20:1, in a range of 1:1 to about 10:1, in a range of about 1:1 to about 5:1 in a range of about 5:1 to about 10:1, in a range of about 5:1 to about 15:1, or in a range of about 10:1 to about 15:1.

In some embodiments, the plasma is a conductively coupled plasma (CCP). The frequency of the plasma can be any suitable frequency. In some embodiments, the plasma frequency is in the range of 50 Hz to 100 MHz, or in the range of 100 kHz, to 60 MHz, or in the range of 500 kHz to 40 MHz, or about 13.56 MHz. The power of the plasma may be any suitable power. In some embodiments, the plasma power is in a range of about 100 W to about 500 W, in a range of about 100 W to about 300 W, or in a range of about 300 W to about 500 W. In some embodiments, the plasma power is about 200 W or about 400 W. In some embodiments, there is no bias power applied to the substrate or substrate support.

In some embodiments, the method 600 further comprises exposing the substrate 510 to a plasma formed from hydrogen gas and/or a plasma formed from oxygen gas. In some embodiments, these plasma exposures are performed before exposing the substrate to the plasma described above with respect to operation 610.

The substrate surface may be maintained at a suitable process temperature during operation 610. In some embodiments, the substrate surface is maintained at the same process temperature during operation 610 as well as any additional plasma exposures. In some embodiments, the substrate surface is maintained at a temperature of about 400° C.

The method 600 may be carried out at any suitable pressure. In some embodiments, the pressure of the processing chamber for method 600 is maintained at about 5 Torr.

The single plasma exposure at operation 610 is able to remove the contaminants from the contaminated dielectric surface 513 and the contaminated metal surface 515 to form a clean dielectric surface 543 and a clean metal surface 545, as described above. Yet, in contrast to method 400, method 600 is performed in a single processing chamber at a single processing temperature.

In some embodiments, the contaminated dielectric surface 513 contains a relatively low concentration of oxygen. In some embodiments, the oxygen content of the contaminated dielectric surface 513 may be less than 20 atomic percent. In these embodiments, the method 600 increases the concentration of oxygen to provide a clean dielectric surface 543. In some embodiments, the clean dielectric surface 543 has an oxygen content of greater than or equal to about 45 atomic percent.

In some embodiments, the contaminated dielectric surface 513 comprises silicon oxynitride and contains a relatively low ratio of oxygen to silicon. In some embodiments, the oxygen to silicon ratio of the contaminated dielectric surface 513 may be less than or equal to about 1.5. In these embodiments, the method 600 increases the ratio of oxygen to silicon to provide a clean dielectric surface 543. In some embodiments, the clean dielectric surface 543 has ratio of oxygen to silicon of greater than or equal to about 3.9.

As described above, in some embodiments, the contaminated metal surface 515 is contaminated with nitrogen. In some embodiments, the nitrogen content of the contaminated metal surface 515 may be greater than or equal to about 15 atomic percent. In these embodiments, the method 600 decreases the concentration of nitrogen to provide a clean metal surface 545. In some embodiments, the clean metal surface 545 has a nitrogen content of less than or equal to about 7.5 atomic percent.

The contaminated metal surface 515 has a reduced reflectivity with respect to silicon than the surface of a pure metal material comprising the same metal(s) without contaminants. Without being bound by theory, it is believed that this reduction in reflectivity is due to the oxidation of or presence of oxygen contaminants on the surface of the metal material. For example, a pure tungsten material has a reflectivity with respect to silicon of about 0.85 at 190 nm and a contaminated metal surface 515 of a tungsten metal material 514 has a reflectivity of less than or equal about 0.8. In some embodiments, the method 600 increases reflectivity to provide a clean metal surface 545. In some embodiments, the metal material 514 comprises tungsten and the clean metal surface 545 has a reflectivity with respect to silicon at 190 nm of greater than or equal to about 0.85.

Without being bound by theory, it is believed that the reduced reflectivity of the contaminated metal surface is a result of the contaminants (specifically oxygen) thereon.

Accordingly, the improvement of the reflectivity evidences a removal of the oxygen contaminants from the contaminated metal surface 515.

In some embodiments, the method 600 further comprises selectively depositing a bulk metal layer on the clean metal surface 545. In some embodiments, the bulk metal layer entirely fills the feature. In some embodiments, the bulk metal layer is deposited on the bottom surface 519 of the feature, growing from the bottom up. In some embodiments, no deposition is observed on the top surface 517 or sidewalls 518. In some embodiments, the bulk metal layer partially fills the feature 516. In some embodiments, the bulk metal layer is coplanar with the top surface 517. In some embodiments, the metal material 514 comprises tungsten and the bulk metal layer comprises tungsten.

EXAMPLES

Example 1—Addition of Hydrogen to Oxygen Plasma Gas

A series of substrates as shown in FIG. 1 with a dielectric material 12 comprising SiN and a metal material 14 comprising tungsten are provided to a processing chamber. The substrates were maintained at 400° C. and the processing chamber maintained at 5 torr. The substrates were exposed to a plasma formed from a plasma gas. The composition of the plasma gas was varied between the substrates as shown in Table 1. The power of the plasma was also varied between the substrates. The oxygen content of the SiN material and the reflectivity with respect to silicon at 190 nm of the tungsten material were evaluated for each substrate before and after exposure to the plasma. The oxygen content and reflectivity results are shown in Table 1.

TABLE 1

| Sample | Ar (sccm) | $O_2$ (sccm) | $H_2$ (sccm) | Plasma Power | O % before | O % after | RI before | RI after |
|---|---|---|---|---|---|---|---|---|
| 1 | 3000 | 60 | 0 | 200 W | 15.5 | 50.5 | 0.844 | 0.361 |
| 2 | 3000 | 60 | 60 | 200 W | 15.6 | 46.7 | 0.844 | 0.456 |
| 3 | 3000 | 60 | 600 | 200 W | 15.6 | 46.8 | 0.846 | 0.88 |
| 4 | 3000 | 60 | 6000 | 200 W | 15.7 | 33.6 | 0.848 | 0.875 |
| 5 | 3000 | 60 | 600 | 400 W | 15.5 | 58.7 | 0.847 | 0.878 |

Example 2—Reduction of Nitrogen Contaminants on Metal Surface

A series of substrates similar to those described in Example 1 were prepared. The substrates were exposed to a plasma formed from a plasma gas comprising $H_2$ and $O_2$ in varying ratios. The plasma power was also varied. The elemental composition for a reference substrate as well as various plasma gas compositions and plasma powers are shown in Table 2.

TABLE 2

| Sample | $H_2$:$O_2$ Ratio | Plasma Power | N % | O % | W % |
|---|---|---|---|---|---|
| 6 | N/A | N/A | 17.1 | 40.6 | 39.7 |
| 7 | 1:1 | 200 W | 8.9 | 48.1 | 40.7 |
| 8 | 10:1 | 200 W | 14.3 | 36.6 | 46.5 |
| 9 | 10:1 | 400 W | 5.0 | 43.5 | 47.3 |

Example 3—CoFlow with Additional Plasmas

A series of substrates similar to those described in Example 1 were prepared. The substrates were exposed to a plasma formed from a plasma gas comprising $H_2$ and $O_2$ ($H_2O_2$) in a 10:1 ratio as well as hydrogen plasma ($H_2$) and/or oxygen plasma ($O_2$). The plasma power was kept constant at 400 W. The reflectivity with respect to silicon of the tungsten surface, the nitrogen content of the tungsten surface and the oxygen to silicon ration of the dielectric surface are shown in Table 3.

TABLE 3

| Sample | Exposures | RI | N % | O:Si |
|---|---|---|---|---|
| 6 | N/A | 0.77 | 22.2 | 1.03 |
| 10 | H2—O2—H2 | 0.29 | 3.2 | 2.04 |
| 11 | H2—O2—H2O2 | 0.32 | 1.0 | 3.67 |
| 12 | H2O2—H2—H2O2 | 0.83 | 1.9 | 3.91 |
| 13 | H2O2—O2—H2—H2O2 | — | — | 3.95 |

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method comprising exposing a substrate surface comprising a damaged dielectric surface and a reduced metal surface to a plasma formed from a plasma gas comprising hydrogen gas and oxygen gas to oxidize the damaged dielectric surface without substantially oxidizing the reduced metal surface,
   wherein the method increases an oxygen content of the damaged dielectric surface to a range of about 40 to about 50 atomic percent.

2. The method of claim 1, wherein the plasma gas further comprises a diluent gas.

3. The method of claim 2, wherein the diluent gas forms greater than or equal to about 95% of the plasma gas.

4. The method of claim 3, wherein plasma gas is formed by delivering to a processing chamber: hydrogen gas with a flow rate in a range of about 0 to about 15 sccm, oxygen gas with a flow rate in a range of about 10 sccm to about 20 sccm and a diluent gas with a flow rate in a range of about 4900 sccm to about 5000 sccm.

5. The method of claim 2, wherein the diluent gas comprises argon.

6. The method of claim 1, wherein a ratio of hydrogen gas to oxygen gas is in a range of about 1:1 to about 1:10.

7. The method of claim 1, wherein the dielectric surface comprises one or more of silicon oxide, silicon nitride or silicon oxynitride.

8. The method of claim 1, wherein the metal surface comprises one or more of tungsten or cobalt.

9. The method of claim 1, wherein the plasma is a microwave plasma with a power in a range of about 2500 W to about 3000 W.

10. The method of claim 1, wherein the substrate surface is exposed to the plasma for a period in a range of about 15 minutes to about 30 minutes.

11. The method of claim 1, wherein the substrate surface is maintained at a temperature of about 400° C.

12. The method of claim 1, wherein a reflectivity of the metal surface after exposure to the plasma is within ±5% of a reflectivity of the metal surface prior to exposure to the plasma.

13. The method of claim 1, wherein a resistivity of the metal surface after exposure to the plasma is within ±10% of a resistivity of the metal surface prior to exposure to the plasma.

14. The method of claim 1, wherein a sheet resistance of the metal surface after exposure to the plasma is within ±10% of a sheet resistance of the metal surface prior to exposure to the plasma.

15. The method of claim 1, further comprising exposing the substrate surface to a hydrogen plasma to form the damaged dielectric surface.

16. A method of selectively oxidizing a dielectric surface, the method comprising exposing a substrate surface comprising a silicon nitride surface and a tungsten surface to a microwave plasma formed from a plasma gas comprising hydrogen gas, oxygen gas and argon to selectively oxidize the silicon nitride surface without oxidizing the tungsten surface, the microwave plasma having a power in a range of about 2500 W to about 3000 W, the plasma gas having an argon concentration of greater than or equal to about 95% on a molar basis, a ratio of hydrogen gas to oxygen gas being in a range of about 1:1 to about 1:10, the substrate surface maintained at a temperature of about 400° C., wherein a property of the tungsten surface is similar before and after exposure to the microwave plasma, the property selected from one or more of reflectivity, resistivity and sheet resistance, and wherein the method increases an oxygen content of the silicon nitride surface to greater than or equal to about 45 atomic percent.

* * * * *